United States Patent [19]
Lew

[11] Patent Number: 5,235,276
[45] Date of Patent: * Aug. 10, 1993

[54] RAPID PULSE MAGNETIC RESONANCE ANALYSIS

[76] Inventor: Hyok S. Lew, 7890 Oak St., Arvada, Colo. 80005

[*] Notice: The portion of the term of this patent subsequent to Mar. 16, 2000 has been disclaimed.

[21] Appl. No.: 744,246

[22] Filed: Aug. 13, 1991

Related U.S. Application Data

[63] Continuation-in-part of Ser. No. 574,766, Jun. 30, 1990.

[51] Int. Cl.$^5$ .............................................. G01V 3/00
[52] U.S. Cl. ..................................... 324/306; 324/309; 128/653.3
[58] Field of Search ............... 324/306, 307, 309, 300; 128/653.3, 653.2

[56] References Cited

U.S. PATENT DOCUMENTS 4,574,240  3/1986  Libove et al. ....................... 324/306
4,901,018  2/1990  Lew ..................................... 324/306
5,093,619  3/1992  Hennig ............................... 324/306

Primary Examiner—Louis Arana

[57] ABSTRACT

The principles of nuclear magnetic resonance are employed to determine material properties of test subjects such as the constituent ratios of component elements making up the test subject and the rate of fluid change taking place in the test subject, in which analysis a plurality of magnetic resonance radiations from the test subject are generated by a plurality of series of 90 degree pulses of alternating magnetic field having different pause periods between adjacent pulses, and each measured value of the intensity of the plurality of magnetic resonance radiations is substituted into a mathematical relationship relating the intensity of the magnetic resonance radiation to a plurality of sources thereof respectively associated with the material properties, which relationship provides a set of simultaneous algebraic equations, that is solved to obtain the numerical values of the material properties.

11 Claims, 2 Drawing Sheets

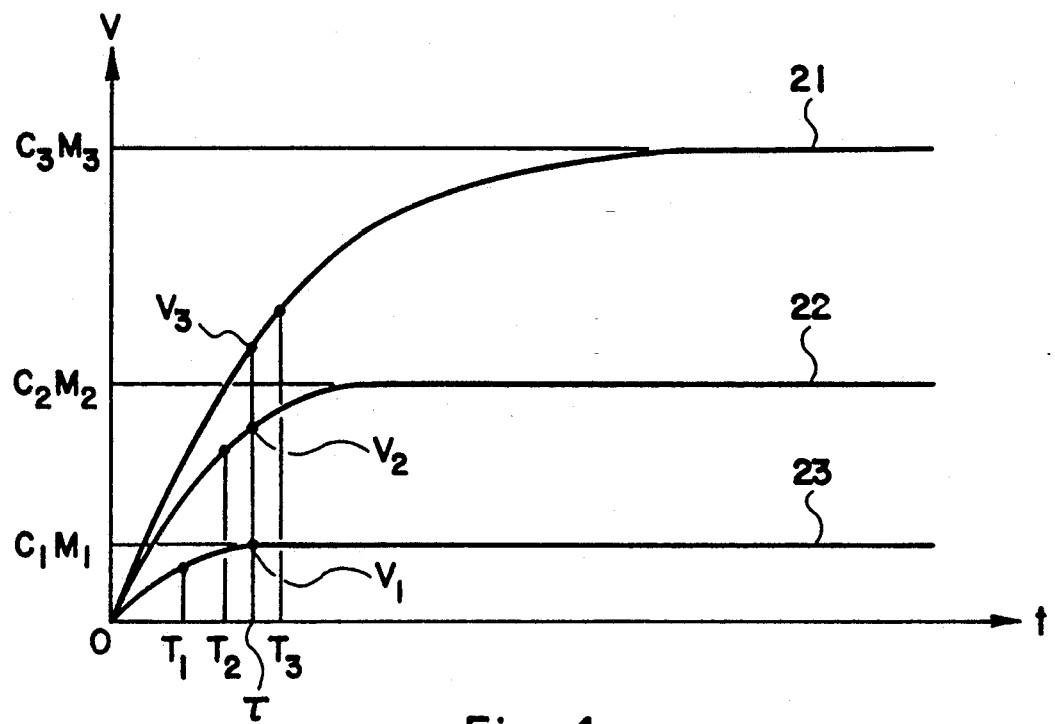
Fig. 4
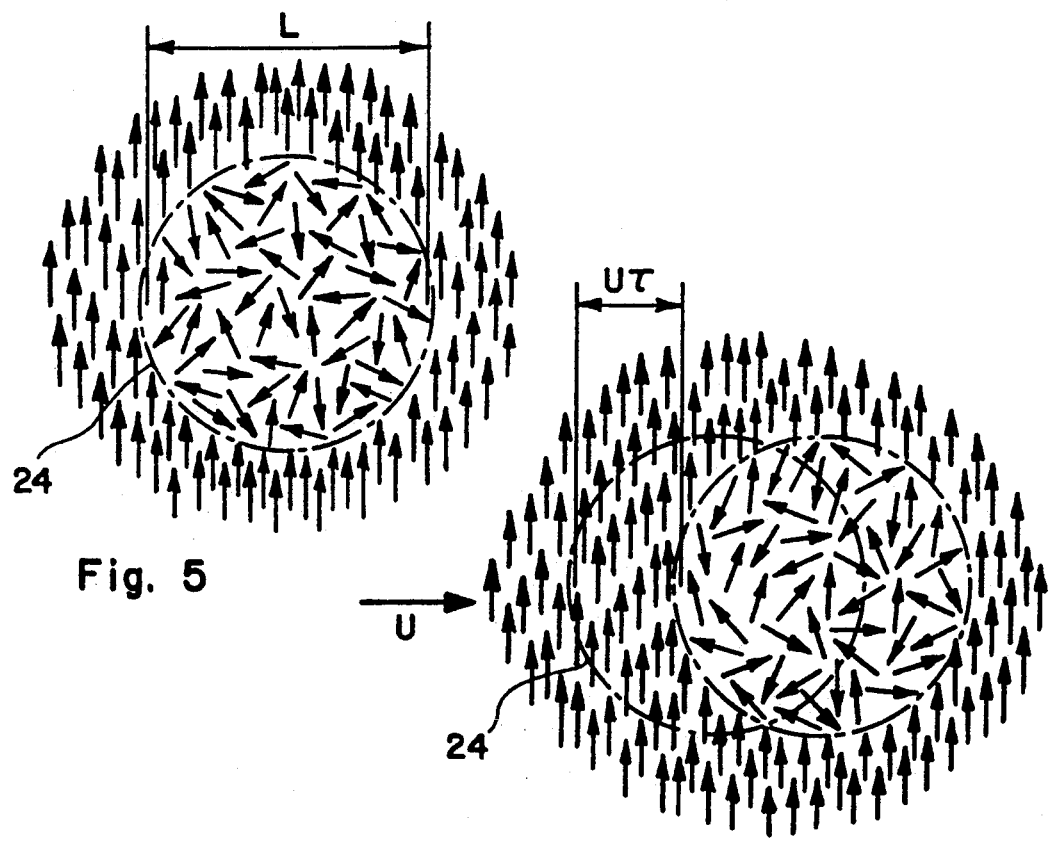
Fig. 5
Fig. 6

RAPID PULSE MAGNETIC RESONANCE ANALYSIS

This patent application is a continuation-in-part to U.S. patent application Ser. No. 07/574,766 entitled "NMR-Scope" filed on Jun. 30, 1990 now pending and, consequently, the priority on the invention described and claimed in the present patent application is based on the afore-mentioned parent application.

There is a need and demand for a noninvasive and nondestructive method and apparatus, which determine the constituent ratios of component elements making up a test mass under medical, scientific and engineering investigation, and the movement of water through the test mass in a flowing or diffusive motion. For example, a healthy tissue mass in the living body must have normal standard constituent ratios of component elements such as water, fat and tissue materials, and abnormal constituent ratios determined by a noninvasive and nondestructive method can be used as an important diagnostic standard or a treatment guideline. The noninvasive and nondestructive method for determining rate of fluid movement through the vascular vessels or interstitial spaces in the living body also provides very useful information for diagnosis and treatment of an abnormal or diseased tissue mass in the living body. The present invention discloses an universal method and apparatus for measuring the constituent ratios of component elements of a tissue mass in the living body or other test masses of scientific, engineering and economic interest as well as the rate of fluid movement therethrough.

A primary object of the present invention is t provide a noninvasive and nondestructive method and device for determining the constituent ratios of component elements making up a mass in the living body or in other matters of scientific, engineering and economic interest. A localized test mass placed in a substantially constant magnetic field is exposed to a series of pulses of alternating magnetic field substantially perpendicular to the constant magnetic field and oscillating at the Larmor frequency or the magnetic resonance frequency appropriate to the strength of the constant magnetic field and the gyromagnetic ratio of element such as hydrogen selected for magnetic resonance tagging. The duty period of the pulses of the alternating magnetic field is set generally equal to or greater than the so called "90 degree pulse" that rotates the nuclei magnets in the test mass lined up with the constant external magnetic field over an angle generally equal to or greater than 90 degrees, while the pause period is set roughly equal to the spin-lattice relaxation time $T_i$ of ith component element making up the test mass under scientific or medical examination. The intensity of the magnetic resonance emission from the test mass generated by the series of pulses of the alternating magnetic field with the pause period roughly equal to the spin-lattice relaxation time of each individual component element is measured for all component elements making up the test mass. The abundance of individual component elements in the test mass are determined by solving a set of simultaneous algebraic equations provided by a set of measured values of the magnetic resonance emissions respectively generated by the set of pulses of the alternating magnetic field with pause period roughly equal to the spin-lattice relaxation times of individual component elements of the test mass.

Another object is to provide a noninvasive and nondestructive method and device for measuring the rate of fluid movement in a test mass in the living body or in other matters of scientific, engineering and economic interest. A localized test mass placed in a substantially constant magnetic field is exposed to a series of pulses of alternating magnetic field substantially perpendicular to the constant magnetic field and oscillating at the Larmor frequency or magnetic resonance frequency appropriate to a combination of the strength of the constant magnetic field and the gyromagnetic ratio of hydrogen making up the major portion of the fluid. The duty period of the pulses of the alternating magnetic field is set generally equal to or greater than the so called "90 degree pulse", while the pause cycle is set to various values substantially less than the spin-lattice relaxation time of the water making up the bulk of the fluid. The rate of fluid flow of fluid diffusion is determined from one or a set of measured values of the magnetic resonance emissions from the fluid generated by the series of pulses of the alternating magnetic field with a number of different pause periods.

The present invention may be described with a greater clarity and specificity by referring to the following figures:

FIG. 4 illustrates the operating principles of the rapid pulse magnetic resonance analysis determining the constituent ratios of component elements making up the test mass.

FIG. 5 illustrates the nuclei magnetic of hydrogen atoms in the test mass located within the test zone outlined by a circle of dotted line, wherein the nuclei magnets are scrampled into random orientations by a series of pulses of the alternating magnetic field limited to the test zone.

FIG. 6 illustrates the movement of the nuclei magnets of hydrogen lined up with the constant magnetic field into the test zone during a pause period between two adjacent pulses of the alternating magnetic field limited to the test zone, which movement alters the intensity of magnetic resonance radiation from the test mass.

Figure 1:
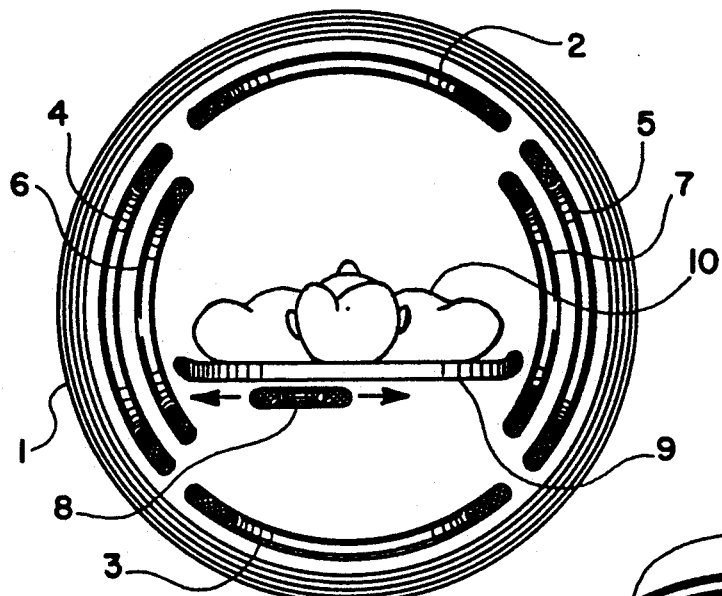
FIG. 1 illustrates a cross section to a structural embodiment of the magnetic resonance device suitable to execute the rapid pulse magnetic resonance analysis of the present invention.

In order to understand the rapid pulse magnetic resonance analysis of the present invention, it is useful to review the principles of the nuclear magnetic resonance phenomenon that provides the theoretical foundation of the present invention. When matter including atoms of nonzero magnetic parity such as the hydrogen atoms is placed in a constant magnetic field, the nuclei magnets of these atoms of nonzero magnetic parity lines up with the force field of constant magnetic field int he same manner that the magnetic compass lines up with the earth's magnetic field, wherein the lining-up process proceeds at different speeds depending on the fluidity of the matter. The time required to reach 63.2 percent of the saturated state in the lining-up of nuclei magnets with the constant magnetic field is called the "spin-lattice relaxation time". When these lined-up nuclei magnets are exposed to alternating magnetic field perpendicular to the constant magnetic field and oscillating at the Larmor frequency of magnetic resonance frequency appropriate to a combination of the strength of the constant magnetic field and the gyromatic ratio of the atoms, the nuclei magnetic experience precessing motion, by which the nuclei magnets spiral away from the north pole orientation coinciding with the constant magnetic field to the equatorial plane perpendicular to the constant magnetic field, and then toward the orientation of the south pole. The pulse of alternating magnetic field, that brings down the nuclei magnets from the north pole orientation to the equatorial plane by the precessing motion is called the "90 degree pulse", while that which rotates the nuclei magnets from the north pole orientation to the south pole orientation is called the "180 degree pulse". Immediately after a 90 degree pulse, the nuclei magnets spiraling back to the north pole from the equatorial plane in "unison" emits a radio frequency electromagnetic radiation oscillating at the Larmor frequency or nuclear magnetic resonance frequency, that decays exponentially in time wherein the magnetic resonance emission decays in amplitude to 36.8 percent in a time interval called the "spin-spin relaxation time" which varies depending on the fluidity of the matter as the case the spin-lattice relaxation time. In actual occurance, the magnetic resonance emission decays away much faster than the decay characterized by the spin-spin relaxation time, the because of the phenomenon called the "free-induction decay" resulting from random mixing in the orientation of the nuclei magnets caused by the non-uniform precession velocity of the nuclei magnets. In general, the free-induction decay takes place in a time interval only a few hundredths of the spin-lattice of spin-spin relaxation time. It must be recognized that a single 90 degree pulse of the alternating magnetic field generates an attenuating pulse of the magnetic resonance radio frequency electromagnetic radiation and, at the same time, scrambles the ordered state of the nuclei magnets. In order to generate another attenuating pulse of the magnetic resonance emission of full intensity by a second 90 degree pulse following a first 90 degree pulse, there must be given a pause period between the two 90 degree pulses sufficiently greater than the spin-lattice relaxation time whereby the line-up of the nuclei magnets with the external magnetic field reaches the saturated state. It has now become clear that, when the magnetic resonance electromagnetic radiation is generated by a series of 90 degree pulses with various pause periods between the adjacent pulses, the amplitude of the magnetic resonance electromagnetic radiation will vary from zero value for pause periods equal to a few hundredths of the spin-lattice relaxation time to the maximum value for the pause period sufficiently greater than the spin-lattice relaxation time. In the rapid pulse magnetic resonance analysis of the present invention, the series of 90 degree pulses is employed to scramble the nuclei magnets of the hydrogen atoms in the sample to varying degrees and to generate the magnetic resonance electromagnetic radiation with amplitude of varying levels by varying the length of pause time in the series of 90 degree pulses, which combination provides information on the constituent ratios of the component elements having different spin-lattice relaxation times, and on the rate of movement of fluid including the water therein.

In FIG. 1 there is illustrated a cross section of a structural embodiment of the magnetic resonance apparatus implementing the rapid pulse magnetic analysis of the present invention, that has a construction similar to the magnetic resonance imaging apparatus of the present day. The elongated tubular dc coil 1 with the central axis perpendicular to the plane of illustration provides the constant magnetic field with magnetic force fields perpendicular to the plane of illustration, wherein the diameter of the coil 1 is progressively varied following the central axis of the dc coil 1 whereby the strength of the constant magnetic field has a gradient in the direction parallel to the central axis of the dc coil 1. The horizontal gradient dc coils 2 and 3 create gradient in the constant magnetic field produced by the dc coil 1 in the horizontal direction, while the vertical gradient coils 4 and 5 create a gradient in the constant magnetic field in the vertical direction. The transmitter coil 6 and 7 provide the alternating magnetic field in a single pulse or series of pulses as they are energized by a single or a series of alternating currents oscillating at the Larmor frequency proportional to the gyromagnetic ratio of the hydrogen atom or other atomic species used as a tag element times the strength of the constant magnetic field at the matrix element of interest. It is noticed that the alternating magnetic field created by the transmitter coils 6 and 7 is generally perpendicular to the constant magnetic field created mostly by the dc coil 1. One or both of the transmitter coils 6 and 7 may be used as the transmitter coil creating the alternating magnetic field as well as the receiver coil collecting the magnetic resonance electromagnetic radiation. Alternatively, a separate receiver coil 8 may be employed, which can be moved close to the specific test mass under investigation. A table 9 supporting a test subject 10 such as a patient is disposed interiorly to the combination of electrical coils 1–7. In order to generate a magnetic resonance electromagnetic radiation from a specific test mass (a localized tissue mass in the patient's body), the alternating magnetic field must oscillate at a frequency with an accuracy of ±0.5 percent of the Larmor frequency or magnetic resonance frequency determined by the strength of the constant magnetic field existing at the region where the test mass is located. The dc coil 1 creates the high intensity constant magnetic field that varies from section to section perpendicular to the central axis of the dc coil 1, and the weak horizontal and vertical gradient coils 2–3 and 4–5 vary the strength of the constant magnetic field crated by the dc coil 1 from point to point on each ross section perpendicular to the central axis of the dc coil 1. As a consequence, the magnetic resonance electromagnetic radiation can be generated from each of the individual test masses respectively occupying each individual matrix subdivision located on each slice of the body by successively varying the frequency of the alternating current energizing the transmitter coils 6 and 7 in the 90 degree pulse in such a way that each frequency matches the strength of the constant magnetic field at each individual matrix subdivision. In the magnetic resonance imaging method practiced at the preset time, the intensities of the magnetic emissions emitted from the test masses respectively occupying the individual matrix subdivisions are plotted to generate an image of a slice of the patient's body. Of course, a three-dimensional image can be constructed by combining images of a series of slices of the patient's body. The essentially same embodiment of the magnetic resonance apparatus shown in FIG. 1 can be used to generate images of water, fat and protein distributions in the localized organs in the body or of the entire body, as well as the image of the body fluid movement such as blood, lymph fluid, urine, etc. in the various vascular vessels and organs in the living body, when the method of the rapid pulse magnetic resonance analysis of the present invention is incorporated thereinto.

Figure 2:
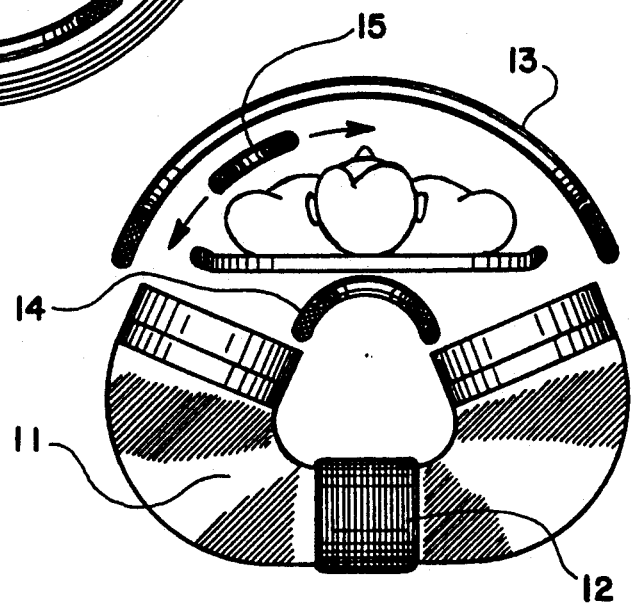
FIG. 2 illustrates a cross section of another structural embodiment of the magnetic resonance device capable of executing the rapid pulse magnetic resonance analysis of the present invention.

In FIG. 2 there is illustrated a cross section of another embodiment of the magnetic resonance apparatus capable of implementing the rapid pulse magnetic resonance analysis. The C-shaped magnet 11 with or without a dc coil 12 provides the constant magnetic field, that varies from point to point. The transmitter coils 13 and 14 energized in a single or a series of pulses by ac currents of various frequencies matched to the strength of the constant magnetic field at various matrix subdivisions generate the magnetic resonance radiations from the test mass occupying different matrix subdivisions. The transmitter coil 13 and 14 generating the alternating magnetic field in pulses may function as the receiver coil, or a separate receiver coil 15 movable to a close proximity to the specific test mass or organ in the patient's body may be employed.

Figure 3:
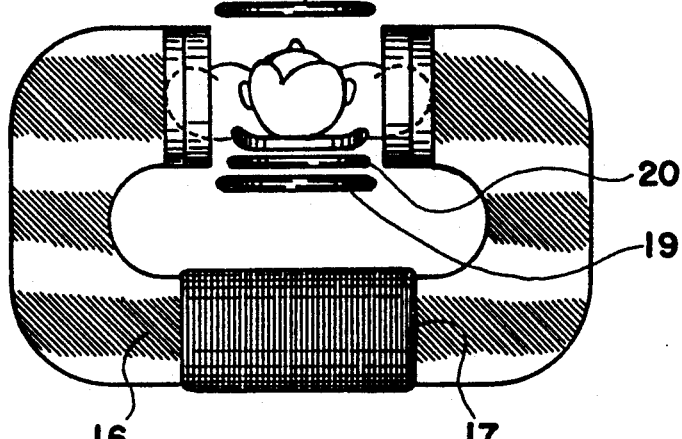
FIG. 3 illustrates a cross section of a further structural embodiment implementing the rapid pulse magnetic analysis of the present invention.

In FIG. 3 there is illustrated a cross section of a further structural embodiment of the magnetic resonance apparatus also capable of implementing the rapid pulse magnetic resonance analysis of the present invention. The C-shaped magnet 16 with or without a dc coil 17 provides a constant magnetic field providing a parallel magnetic force field, which may or may not vary in strength in a direction perpendicular to the magnetic force field. A pair of transmitter coils 18 and 19 energized by a single or a series of pulses of ac current provides the alternating magnetic field that is perpendicular to the constant magnetic field provided by magnet 16. A receiver coil 20 collects the magnetic resonance radiation. Of course, instead of the separate receiver coil 20, one or both of the transmitter coils 18 and 19 may function as the receiver coil. When the constant magnetic field provided by the magnet 16 is uniform in direction as well as in strength, a specific test mass occupying a certain zone in the test section between the two poles of the magnet 6 can be selectively energized by varying the intensity or duty period of the ac current energizing the transmitter coils 18 and 19 in such a way that the transmitter coil produces a 90 degree pulse only at a specific matrix subdivision of interest in the test section. This embodiment shown in FIG. 3 is better suited for analyzing a reasonably large test mass occupying a sizable space volume in the test section, while the embodiments shown in FIG. 1 and 2 are more suitable for analyzing a series of small test masses and generating an image of distribution of the constituent components or the image of fluid movements in the test subject.

In FIG. 4 there is illustrated the operating principles of the rapid pulse magnetic resonance analysis determining the constituent ratios of component elements making up the test mass. The magnetization or spin-lattice relaxation time T has different values for different component elements. For example, the spin-lattice relaxation time of water is equal to about 5 seconds, that of fat is of the order of 100 milliseconds or less and that of muscle tissues is of the order of a few milliseconds. The total level of magnetization in a test mass comprising three different component elements respectively having the spin-lattice relaxation times equal to $T_1$, $T_2$ and $T_3$ is the sum of the levels of magnetizations in the three component elements represented by the curves 21, 22 and 23, respectively. After the initial magnetizations in all three component elements are scrambled by a first 90 degree pulse of the alternating magnetic field at time $t=0$, the three different component elements attains different level of magnetizations at a time $t=\tau$ as the component elements with smaller values of the spin-lattice relaxation time T reaches the saturation in magnetization much faster than the component elements with larger values of the relaxation time T. It is not difficult to realize that the intensity V of the magnetic resonance radiation emitted from the test mass, that is generated by a series of 90 degree pulses with a pause period equal to $\tau$, is the sum of the magnetic resonance radiation $V_i$ from each individual component elements with constituent mass $M_i$, i.e., $$V = V_1 + V_2 + V_3. \tag{1}$$

The magnetic resonance emission from each component element is proportional to the level of magnetization times the constituent mass, which can be expressed in equation $$V_i = C_i M_i \left[ 1 - \exp\left(-\frac{\tau}{T_i}\right) \right], \tag{2}$$

where $C_i$ is a physical constant, that can be determined empirically for each of the individual component elements of known material type, and exp stands for exponential function. Substitution of the equation (2) into the equation (1) yields $$V = C_1 M_1 \left[ 1 - \exp\left(-\frac{\tau}{T_1}\right) \right] + C_2 M_2 \left[ 1 - \exp\left(-\frac{\tau}{T_2}\right) \right] + C_3 M_3 \left[ 1 - \exp\left(-\frac{\tau}{T_3}\right) \right]. \tag{3}$$

In general, if the test mass comprises n different component elements, n different equations of the following form can be obtained by measuring n different values of the intensity of the magnetic resonance emission from the test mass respectively generated by a set of series of 90 degree pulses with n different values of the pause time $\tau j$ where the numerical values of $\tau j$ should be spread over a region extending from the smallest value of the spin-lattice relaxation time of the component elements to the largest value thereof, or the numerical values of $\tau j$ are set respectively equal to the spin-lattice relaxation times $T_j$ of the component elements:

$$V_j = \sum_{i=1}^{n} C_i M_i \left[ 1 - \exp\left(-\frac{\tau_j}{T_i}\right) \right], j = 1, 2, 3, \ldots n. \tag{4}$$

The n different simultaneous algebraic equations (4) include n different unknowns $M_i$. Consequently, equations (4) can be solved for n different $M_i$, which solution provides the numerical values of the constituent mass $M_i$ of all individual component elements. By combining the results of constituent analysis of individual test masses respectively occupying all of the matrix subdivisions described in conjunction with FIG. 1, an image of distribution of water, fats, muscle tissues in an organ in the living body or in the entire living body can be constructed. This method of the constituent ratio analysis by the rapid pulse magnetic resonance analysis provides a much more versatile means yielding much more accurate results compared with the well known method of so called the "spin-echo" analysis widely practiced at the present time.

In FIGS. 5 and 6 there is illustrated the operating principles of the rapid pulse magnetic resonance analysis measuring the flow rate of fluid or diffusion rate of fluid in the test mass located within a test zone outlined by dotted line 24, which defines the domain wherein the pulse of the alternating magnetic field providing the 90 degree pulse is limited to. As the series of 90 degree pulses scrambling the nuclei magnets in the test subject is limited to the test zone 24, that is a subregion under the constant magnetic field, the nuclei magnets in the portion of the test subject outside the test zone 4 remains at the saturated state in magnetization, while the nuclei magnets in the portion of the test subject within the test zone, that is the test mass, is scrambled by a series of 90 degree pulse with pause time equal to $\tau$. If there is no movement of the fluid through the test mass, the intensity of the magnetic resonance emission from the test mass located within the test zone is given by equation $$V_O = C_S M_S \left[ 1 - \exp\left(-\frac{\tau}{T_S}\right)\right] + \tag{5}$$

$$C_F M_F \left[ 1 - \exp\left(-\frac{\tau}{T_F}\right)\right],$$

where the subscripts S and F respectively stand for the solid and fluid material making up the test mass, $C_S$ and $C_F$ are physical constants determined empirically, $M_S$ and $M_F$ are the masses of the solid and fluid component elements making up the test mass, and $T_S$ and $T_F$ are the spin-lattice relaxation times of the solid and fluid component elements, respectively. When there is a mass flow rate of fluid taking place in the test mass due to the fluid velocity U, the intensity of the magnetic resonance emission from the test mass generated by a series ob 90 pulses with pause period equal to $\tau$ becomes $$V_U = C_S M_S \left[ 1 - \exp\left(-\frac{\tau}{T_S}\right)\right] + \tag{6}$$

$$C_F(1-\phi) M_F \left[ 1 - \exp\left(-\frac{\tau}{T_F}\right)\right] + C_F \phi M_F \frac{U\tau}{L} +$$

$$C_F \phi M_F \left[ 1 - \exp\left(-\frac{\tau}{T_F}\right)\right]\left(1 - \frac{U\tau}{L}\right), U\tau \leq L$$

where $\phi$ is the fraction of the total fluid mass in the test mass, which fraction moves at the velocity U, and L is the characteristic linear dimensions of the test zone 24. It becomes clear from the equations (5) and (6) that the intensity of the magnetic resonance emission from the test mass generally increases in proportion to the fluid velocity U. The equation (6) can be rearranged in the form $$V_U = C_S M_S \left[ 1 - \exp\left(-\frac{\tau}{T_S}\right)\right] + \tag{7}$$

$$C_F M_F \left[ 1 - \exp\left(-\frac{\tau}{T_F}\right)\right] +$$

$$C_F \dot{M} \frac{\tau}{L} \left[ \exp\left(-\frac{\tau}{T_F}\right)\right], U\tau \leq L$$

where $\dot{M} = \phi_F U$ is the mass rate or mass diffusion rate taking place in the test mass, which quantity may be called the "rate of fluid change" in general. The equation (7) includes 3 unknowns, e.g., $M_S$, $M_F$ and $\dot{M}$. When the intensity of the magnetic resonance emission from the test mass is measured for three different values of the pause period $\tau$, a set of three simultaneous linear algebraic equations respectively corresponding to the equation (7) result in $$V_U(\tau_i) = C_S M_S \left[ 1 - \exp\left(-\frac{\tau_i}{T_S}\right)\right] + \tag{8}$$

$$C_F M_F \left[ 1 - \exp\left(-\frac{\tau_i}{T_F}\right)\right] +$$

$$C_F \dot{M} \frac{\tau_i}{L} \left[ \exp\left(-\frac{\tau_i}{T_F}\right)\right], U\tau_i \leq L \text{ and } i = 1, 2 \text{ and } 3.$$

The simultaneous linear algebraic equations (8) are solved for $M_S$, $M_F$ and $\dot{M}$, which results provide the constituent masses of the solid and stationary fluid component element sin the test mass as well as the rate of fluid change taking place in the test mass. The equation (7) may also be written in the form $$V_U - V_O = C_F \dot{M} \frac{\tau}{L} \left[ \exp\left(-\frac{\tau}{T_F}\right)\right], \tag{9}$$

where $V_O$ is the intensity of the magnetic resonance emission from the test mass given by the equation (5) when the fluid flow through the test mass is artificially blocked or constricted. The equation (9) should be used to determine the rate of fluid change taking place in the test mass when the fluid flow therethrough can be artificially blocked or constricted momentarily, or the intensity of magnetic resonance emission from the solid and stationary fluid component elements in the test mass is known or determined by an empirical or heuristic method. For example, if the solid component element in the test mass is made of materials emitting a little or no magnetic resonance emission and the stationary fluid component element in the test mass is largely water, the equation (8) as well as the equation (9) reduces to the following form when the pause period $\tau_i$ or $\tau$ is set equal to a few hundredths of the spin-lattice relaxation time of water as the series of 90 degree pulses of the alternating magnetic field with such a small value of the pause period generates little magnetic resonance emission from the stationary water:

$$V_U = C_F \dot{M} \frac{\tau}{L} \left[ \exp\left(-\frac{\tau}{T_F}\right)\right], \tau << T_F \text{ or} \tag{10}$$

$$V_U \approx C_F \dot{M} \frac{\tau}{L}\left(1 - \frac{\tau}{T_F}\right), \tau \ll T_F. \quad (11)$$

The equation (10) or (11) provides a simple mathematical relationship that relates the intensity of the magnetic resonance emission from the moving water to the rate of fluid change in an approximate manner, which equation provides a reasonably accurate answer for the rate of fluid change taking place in the test mass when both the stationary fluid trapped within and the fluid moving through the test mass are largely water and the moving fluid s moving at a velocity U that is of the same order of magnitude as that of L/$\tau$, where L is the characteristic linear dimension of the test mass. By combining the data on the rate of fluid change taking place in a plurality of test masses forming a set of matrix subdivisions of the test subject described in conjunction with FIG. 1, an image of vascular vessels as well as an image of other fluid passages in a portion of or in the entire living body can be generated. One of many useful applications of the equation (8) or (9) in medical science will be the diagnosis of the narrowing down of blood vessels caused by deposits of fatty matters on the wall of the blood vessels or by other pathological causes.

The exponential functions appearing in the equations (2)–(10) as an idealized mathematical form of the relaxation functions may be replaced by other forms of monotonically decaying functions, which are determined empirically. While the principles of the present invention have now been made clear by the illustrative embodiments, equations and descriptions thereof, there will be many modifications in the structural arrangement of the magnetic resonance apparatus, form of the mathematical equations and procedures of usage thereof, which are obvious to those skilled in the art and particularly adapted to the specific working environments and operating conditions in the practice of the invention without departing from those principles. It is not desired to limit the invention to the illustrative embodiments and the equations shown and described and accordingly, all suitable modifications and equivalents thereof may be regarded as falling within the scope of the invention as defined by the claims which follow.

The embodiments of the invention, in which an exclusive property or privilege is claimed, are defined as follows:

1. A method for determining solid-fluid state properties of a test mass forming a portion of a test subject, comprising in combination:

a) placing the test subject in a substantially constant magnetic field wherein the test mass is exposed to an alternating magnetic field generally perpendicular to the constant magnetic field and oscillating at a magnetic resonance frequency appropriate to a combination of the strength of the constant magnetic field existing in a region occupied by the test mass and the gyromagnetic ratio of an atomic species included in the test mass that produces magnetic resonance effect, said alternating magnetic field altering ordered orientations of nuclei magnets belonging to said atomic species included in the test mass without significantly altering ordered orientations of nuclei magnets belonging to said atomic species located outside the test mass;

b) identifying number of the solid-fluid state properties to be determined;

c) generating a plurality of magnetic resonance radiations from the test mass by exposing the test mass to a plurality of series of pulses of the alternating magnetic field having different values of pause period between adjacent pulses, and measuring intensities of each of the plurality of magnetic resonance radiations, wherein number of said plurality of magnetic resonance radiations is at least equal to number of the solid-fluid state properties to be determined;

d) establishing a mathematical relationship defining magnetic resonance radiation from the test mass as a sum of a plurality of magnetic resonance radiations respectively emitted in association with the solid-fluid state properties to be determined;

e) constructing a set of simultaneous algebraic equations in number at least equal to the number of the solid-fluid state properties to be determined by substituting the measured intensities of the plurality of magnetic resonance radiations from the test mass into said mathematical relationship; and f) determining numerical values of the solid-fluid state properties to be determined by solving the set of simultaneous algebraic equations for the solid-fluid state properties to be determined.

2. A method as set forth in claim 1 wherein carrying out said method for determining the solid-fluid state properties of the test mass for a plurality of test masses forming a set of matrix subdivisions of the test subject, and constructing an image representing a spatial distribution of at least one of the solid-fluid state properties in the test subject by assembling the numerical values of the solid-fluid state properties of the plurality of test masses.

3. A method as set forth in claim 1 wherein the solid-fluid state properties to be determined comprises constituent ratios of component elements of n different species making up the test mass, and said set of simultaneous algebraic equations is of the following form:

$$V_j = \sum_{i=1}^{n} C_i M_i \left[1 - f\left(\frac{\tau_j}{T_i}\right)\right], \text{ for } j = 1, 2, \ldots n,$$

where $V_j$ is the measured intensity of jth magnetic resonance radiation of said plurality of magnetic resonance radiations from the test mass, that is generated by one of the plurality of series of pulses of the alternating magnetic field with pause period equal to $\tau_j$, $C_i$ is an empirically determined physical coefficient representing effectiveness of ith component element in emitting magnetic resonance radiation, $M_i$ is mass of ith component element, $T_i$ is an empirically determined relaxation time characterizing speed of magnetization of ith component element, and f stands for an empirically determined monotonically decaying mathematical function; wherein the set of simultaneous algebraic equation is solved for $M_i$'s as a measure of constituent ratios of component elements making up the test mass.

4. A method as set forth in claim 3 wherein the monotonically decaying mathematical function f is equal to an inverse of exponential function.

5. A method as set forth in claim 3 wherein carrying out said method for determining the constituent ratios of component elements making up the test mass for a plurality of test masses forming a set of matrix subdivisions of the test subject, and constructing an image representing a spatial distribution of at least one of the component elements in the test subject by assembling the numerical values of the constituent ratios of the plurality of test masses.

6. A method as set forth in claim 1 wherein the solid-fluid state properties to be determined comprises intensities of magnetic resonance radiations from stationary component elements making up the test mass and rate of fluid change taking place in the test mass, and said set of simultaneous algebraic equations is of the following form:

$$V(\tau_i) = (C_S M_S)\left[1 - f\left(\frac{\tau_i}{T_S}\right)\right] +$$

$$(C_F M_F)\left[1 - f\left(\frac{\tau_i}{T_F}\right)\right] +$$

$$C_F \dot{M} \frac{\tau_i}{L} f\left(\frac{\tau_i}{T_F}\right), \; U\tau_i \leq L \; and \; i = 1, 2 \; and \; 3,$$

where $V(\tau_i)$ is the measured of ith magnetic resonance radiation of said plurality of magnetic resonance radiations from the test mass, that is generated by one of the plurality of series of pulses of the alternating magnetic field with pause period equal to $\tau_i$, $C_S$ and $C_F$ are empirically determined physical coefficients respectively representing effectiveness of solid and fluid component elements making up the test mass in emitting magnetic resonance radiation, $M_S$ and $M_F$ are respectively masses of stationary solid and stationary fluid component elements in the test mass, $\dot{M}$ is the rate of fluid mass change taking place in the test mass, $T_S$ and $T_F$ are respectively empirically determined relaxation times characterizing speed of magnetization of the solid and fluid component elements, L is the characteristic linear dimension of the test mass, and f stands for an empirically determined monotonically decaying mathematical function; wherein the set of simultaneous algebraic equations is solved for $(C_S M_S)$, $(C_F M_F)$ and $\dot{M}$ and the rate of fluid change taking place in the test mass is determined from the numerical value of $\dot{M}$.

7. A method as set forth in claim 6 wherein the monotonically decaying mathematical function f is equal to an inverse of exponential function.

8. A method as set forth in claim 6 wherein carrying out said method for determining the intensities of magnetic resonance radiations from stationary component elements making up the test mass and rate of fluid change taking place in the test mass for a plurality of test masses forming a set of matrix subdivisions of the test subject, and constructing an image representing a spatial distribution of at least one of the intensities of magnetic resonance radiations from stationary component elements and the rate of fluid change in the test subject by assembling the numerical values of said one of the intensities of magnetic resonance radiations from stationary component elements and the rate of fluid change in the plurality of the test masses.

9. A method for determining rate of fluid change taking place in a test mass forming a portion of a test subject, comprising in combination:
 a) placing the test subject in a substantially constant magnetic field wherein the test mass is exposed to an alternating magnetic field generally perpendicular to the constant magnetic field and oscillating at a magnetic resonance frequency appropriate to a combination of the strength of the constant magnetic field existing in a region occupied by the test mass and the gyromagnetic ratio of an automatic species included in the test mass that produces magnetic resonance effect, said alternating magnetic field altering ordered orientations of nuclei magnets belonging to said atomic species included in the test mass without significantly altering ordered orientations of nuclei magnets belonging to said atomic species located outside the test mass;
 b) generating at least one magnetic resonance radiation from the test mass by exposing the test mass to a series of pulses of the alternating magnetic field with a pause period between adjacent pulses, said pause period having such a length that a significant amount of fluid change takes place in the duration of the pause period, and measuring intensity of the magnetic resonance radiation from the test mass;
 c) determining intensity of magnetic resonance radiation from stationary solid and stationary fluid component elements in the test mass empirically; and
 d) determining rate of fluid change taking place in the test mass from difference in intensity between the magnetic resonance radiation from the test mass and the magnetic resonance radiation from the stationary solid and stationary fluid in the test mass.

10. A method as set forth in claim 9 wherein the pause period in the series of pulses of the alternating magnetic field is set to a value much smaller than spin-lattice relaxation time of fluid component element in the test mass, whereby the stationary fluid component element in the test mass emits magnetic resonance radiation of negligibly small intensity.

11. A method as set forth in claim 9 wherein intensity of magnetic resonance radiation from the stationary solid and stationary fluid component elements in the test mass is heuristically set equal to zero.

* * * * *